(12) United States Patent
Mehta et al.

(10) Patent No.: US 7,246,283 B1
(45) Date of Patent: Jul. 17, 2007

(54) METHOD AND APPARATUS FOR MANAGING TESTING IN A PRODUCTION FLOW

(75) Inventors: Naresh Mehta, Santa Clara, CA (US); Parmeshwar Reddy Bayappu, Sunnyvale Clara, CA (US); Kyle Bowers, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 406 days.

(21) Appl. No.: 10/638,835

(22) Filed: Aug. 11, 2003

(51) Int. Cl.
*G01R 31/28* (2006.01)
(52) U.S. Cl. ..................... 714/724
(58) Field of Classification Search ............. None
See application file for complete search history.

(56) References Cited

U.S. PATENT DOCUMENTS

| | | | | |
|---|---|---|---|---|
| 5,966,459 A | * | 10/1999 | Chen et al. | 382/149 |
| 6,047,293 A | * | 4/2000 | Blitz | 707/104.1 |
| 6,321,352 B1 | * | 11/2001 | Wasson | 714/724 |
| 6,347,386 B1 | * | 2/2002 | Beffa | 714/718 |
| 6,367,040 B1 | * | 4/2002 | Ott et al. | 714/724 |
| 6,434,503 B1 | * | 8/2002 | Sommer | 702/123 |
| 6,480,979 B1 | * | 11/2002 | Tomari | 714/724 |
| 6,530,047 B1 | * | 3/2003 | Edwards et al. | 714/724 |
| 6,601,200 B1 | * | 7/2003 | Delp et al. | 714/724 |

* cited by examiner

*Primary Examiner*—Guy Lamarre
*Assistant Examiner*—Steven D. Radosevich
(74) *Attorney, Agent, or Firm*—L. Cho

(57) ABSTRACT

A method for managing testing of test material is disclosed. An electronic traveler associated with the test material is identified. The test materials are tested as specified by the electronic traveler. Test results from the tests are recorded onto the electronic traveler.

23 Claims, 5 Drawing Sheets

METHOD AND APPARATUS FOR MANAGING TESTING IN A PRODUCTION FLOW

FIELD OF THE INVENTION

The present invention relates to a system for managing testing in a production flow. More specifically, the present invention relates to a method and apparatus for testing materials such as dies on wafer lots in a production flow.

BACKGROUND

Production flows used for testing dies on wafer lots typically require several thousands of test procedures to be performed on each of the dies by a plurality of multi-function test equipment. Each piece of test equipment may be capable of running a number of test procedures that may be applicable to certain types of materials. Test equipment operators who receive wafer lots on the production floor are required to manually input data associated with the wafer lots, and select specific tests to run on the wafer lots. After the tests are run, the test equipment operator would be required to manually record the test results. The test equipment operator may also be required to determine a next course of action to take in response to the test results.

In the past, a physical document was typically used to convey information to the test equipment operator regarding a wafer lot to be tested on the production floor such as the lot identifier and specific test programs to be run. This physical document was also used to record test results and often included rules to be applied to determine how to further process the wafer lot. However, since the information on the physical document had to be processed by the test operators, many of the errors associated with testing materials such as wafer lots on the production floor could be attributed to human error in interpreting information from the physical document or entering data onto the physical document. In addition, the use of the physical document proved to be inefficient for tracking the wafer lot on the production floor and tracking the document itself.

Thus, what is needed is an effective and efficient method and apparatus for managing testing in a production flow that reduces the problems associated with requiring human operators to retrieve, interpret, and enter information on a physical document.

SUMMARY

A method and apparatus for managing testing in a production flow is disclosed. According to an embodiment of the present invention, a production traveler system facilitates the testing process by reducing the role of test equipment operators. A tester manager is used with an electronic traveler to identify which test programs test equipment should run on test material. The test manager and electronic traveler may also be used to directly record test results from the test equipment, and assist in determining a course of action to take in response to the test results. The electronic traveler is readable by the test manager on test equipment which allows the test equipment to access information used for testing and processing the test material without requiring the test operators to input or interpret the information.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between blocks may be shown as buses or as single signal lines. Each of the buses may alternatively be single signal lines, and each of the single signal lines may alternatively be buses.

Figure 1:
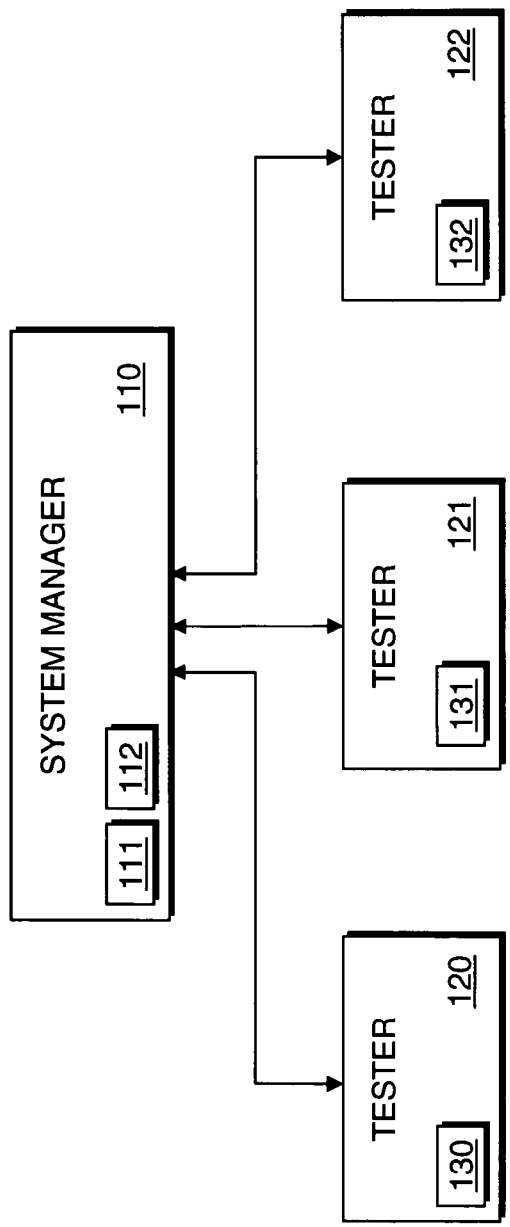
FIG. 1 is a block diagram illustrating a test system according to an embodiment of the present invention.

FIG. 1 is a block diagram illustrating a test system 100 according to an embodiment of the present invention. The test system 100 includes a plurality of testers or pieces of test equipment. Block 120 represents a first tester, block 121 represents a second tester, and block 122 represents an Nth tester, where N may be any number. Each of the testers 120-122 may be implemented, for example, by a computer system that is capable of storing and executing a plurality of test programs for testing various test materials. According to an embodiment of the present invention, the testers 120-122 may store a plurality of test programs used, for example, to sort wafers, perform optical inspections, test packaging, or perform other types of tests on test materials.

The test system 100 includes a system manager 110. The system manager 110 is coupled to the testers in the test system 100. The system manager 110 includes an electronic traveler manager 111. The electronic traveler manager 111 may include a database (not shown) for storing electronic travelers. According to an embodiment of the present invention, an electronic traveler is an electronic document associated with test material to be tested by the test system 100. The electronic traveler includes information about its associated test material, the identity of testers on a production floor to be used to test the test material, specific test programs that are to be run by the testers, and rules relating to how the test material should be further processed in response to test results. The electronic traveler may also be used to record test results generated from testers on the production floor. The electronic traveler has an electronic traveler identifier. The electronic traveler identifier is marked or labeled on its associated test material and is used to link the electronic traveler to the test material.

Each of the testers 120-122 includes a tester manager. Testers 120-122 include tester managers 130-132 respectively. According to an embodiment of the present invention, a tester manager accesses an electronic traveler associated for test material to be tested and utilizes the information on the electronic traveler to manage its corresponding tester. The tester manager may determine from the electronic traveler whether its corresponding tester is to be used to test a particular test material, which test programs to run on the test material, and how to apply the test results to determine how to further process the test material.

Figure 2:
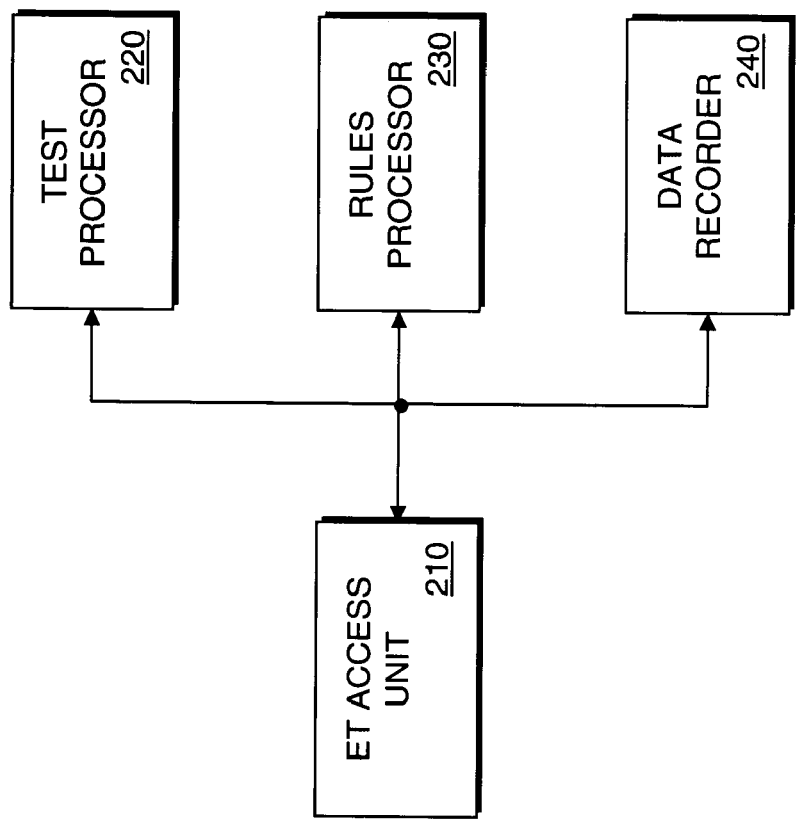
FIG. 2 is a block diagram of a tester manager according to an embodiment of the present invention.

FIG. 2 is a block diagram of a tester manager 200 according to an embodiment of the present invention. The tester manager 200 may be used to implement any one of the tester managers 130-132 shown in FIG. 1. FIG. 2 illustrates modules implementing an embodiment of a tester manager. According to one embodiment, tester management may be performed by a computer system executing sequences of instructions represented by the modules shown in FIG. 2. Execution of the sequences of instructions causes the computer system to support tester management as will be described hereafter. In alternate embodiments, hardware circuitry may be used in place of or in combination with software instructions to implement the present invention. Thus, the tester manager 200 is not limited to any specific combination of hardware circuitry and software.

The tester manager 200 includes an electronic traveler access unit 210. The electronic traveler access unit 210 receives an electronic traveler identifier associated with test material and retrieves the electronic traveler corresponding to the electronic traveler identifier. According to an embodiment of the tester manager 200, the electronic traveler access unit 210 communicates with the electronic traveler manager 111 (shown in FIG. 1) on the system manager 110 (shown in FIG. 1) and retrieves the appropriate electronic traveler from its database. In this embodiment, the electronic traveler access unit 210 may also provide the electronic traveler manager 111 with an updated version of an electronic traveler when a tester has added new information to the electronic traveler. According to an embodiment of the present invention, the electronic traveler identifier is labeled on test material to be tested with a bar code. In this embodiment, each of the testers in the test system 100 (shown in FIG. 1) may include a bar code reader for scanning the bar code into the electronic traveler access unit 210. It should be appreciated that the electronic traveler identifier may also be labeled using other human or computer-readable markings and that the electronic traveler identifier may be provided to the electronic traveler access unit 210 using other techniques.

The tester manager 200 includes a test processor 220. The test processor 220 is coupled to the electronic traveler access unit 210 and retrieves information from the electronic traveler regarding the test procedures that are to be performed on the test material. The test processor 220 loads the test procedures to be performed on the test material. The test processor 220 also configures the tester to support any special condition that may be required by the test material. The test processor 220 then proceeds to run the test procedures supported by the tester.

The tester manager 200 includes a rules processor 230. The rules processor 230 is coupled to the electronic traveler access unit 210 and retrieves information regarding rules to be used in processing test results generated by the tester to determine how to further process the test material. Rules for determining how to further process the test material may include instructions that specify a post test operation qualification criteria such as yield or other criteria before proceeding to a next step on the tester or another tester, re-testing, performing alternate test procedures, discarding, or putting the test material on hold for inspection. The rules processor 230 applies the rules to the test results generated by the tester and determines how to further process the test material. According to an embodiment of the tester manager 200, the rules processor 230 operates with the test processor 220 and informs the test processor 220 whether to proceed with testing the test material and identifies which test procedure to run.

The tester manager 200 includes a data recorder 240. The data recorder 240 records test results generated by the tester and decisions made by the rules processor 230 on the electronic traveler and/or other medium. When the tester is finished testing the test material, an updated electronic traveler may be transmitted back to the electronic traveler manager 111 of the system manager 110 via the electronic traveler access unit 210.

It should be appreciated that the electronic traveler access unit 210, test processor 220, rules processor 230 and data recorder 240 may be implemented using any known circuitry or any known technique. In an embodiment of the present invention where the test manager 200 is implemented in hardware, the electronic traveler access unit 210, test processor 220, rules processor 230 and data recorder 240 all reside on a single semiconductor substrate.

According to an embodiment of the present invention, electronic traveler templates may be created using standard blocks such as guidelines and procedures that have been pre-approved for testing specific test materials. Once the electronic traveler templates are created, they may be approved electronically by others. The electronic traveler templates may then be stored in the electronic traveler manager 111. When new test materials arrive to be tested, the electronic traveler templates may be used to generate an appropriate electronic traveler for the test materials, and a unique electronic traveler identifier may be assigned to the test materials and the electronic traveler.

The test system 100 (shown in FIG. 1) utilizes the electronic traveler to dynamically control a process flow and reduce the interaction required for test equipment operators on a production floor. Test managers 130-132 in testers 120-122 directly upload data such as information about the test materials and the names of test programs to run from the electronic traveler. Test managers 130-132 also directly analyze test results by applying rules on the electronic traveler to determine how to further process the test materials and record test results on the electronic traveler and/or other medium. This results in reducing the time required for the testing process. This also improves data and operation accuracy by reducing manual data entries and automating portions of the test material evaluation process.

Figure 3:
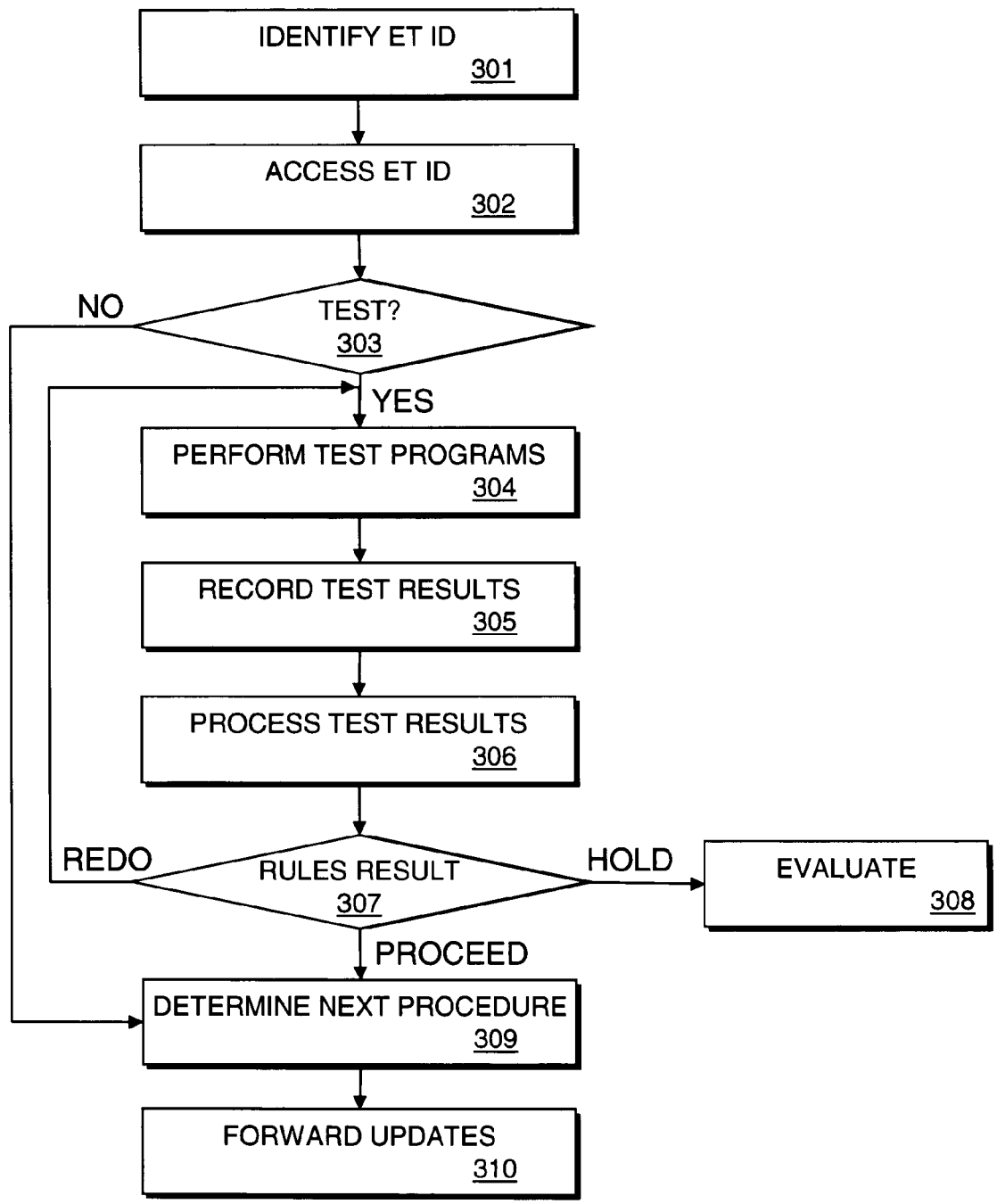
FIG. 3 is a flow chart illustrating a method for managing testing with an electronic traveler according to an embodiment of the present invention.

FIG. 3 is a flow chart of a method for managing testing using an electronic traveler according to an embodiment of the present invention. At 301, an electronic traveler identifier associated with test material is identified. According to one embodiment, the electronic traveler identifier may be labeled with a bar code on the test material and the electronic traveler identifier may be read using a bar code reader.

At 302, an electronic traveler corresponding to the electronic traveler identifier is accessed. This may be achieved, for example, by retrieving the electronic traveler from a database in a system manager.

At 303, it is determined whether the test materials are to be tested by a tester. According to one embodiment, a list of test programs that are supported by the tester is compared with a list of test programs on an electronic traveler associated with the test material that need to be performed. If the tester supports test programs that need to be performed on the test material, control proceeds to 304. If the tester does not support test programs that need to be performed on the test material, control proceeds to 309. Alternatively, the identity of testers on a production floor having test programs that are to be run on the test material may be provided on the electronic traveler and determining whether test materials are to be tested by a tester may be achieved by utilizing this information.

At 304, the test programs are performed. According to an embodiment of the present invention, performing the test programs includes identifying test programs to be run on the test material as specified by the electronic traveler, loading the test programs on the tester, and running the test programs on the tester.

At 305, the test results are recorded. The test results may be recorded on the electronic traveler and/or another medium.

At 306, the test results are processed. According to an embodiment of the present invention, the test results are processed utilizing rules on the electronic traveler that specify how the test materials should be further processed in response to the test results.

At 307, if it is determined that pursuant to the rules that test procedures in the test programs should be re-run on the test materials, control proceeds to 304. If it is determined pursuant to the rules that the test materials should be held, control proceeds to 308. If it is determined that pursuant to the rules that testing should continue, control proceeds to 309.

At 308, the test materials are held to be evaluated. The test materials may be inspected by a process engineer, for example, who may determine that the test materials need to be discarded, re-tested (thus proceeding to 304), or moved to a next procedure (thus proceeding to 309).

At 309, a next procedure is determined for the test material. This may be determined by referencing the electronic traveler which may direct the test material to be tested by a next test program on the tester or another tester. Alternatively, the electronic traveler may indicate that testing of the test material is completed.

At 310, decisions regarding rules and other updates on the electronic traveler and test material may be forwarded to appropriate destinations such as the system manager and/or other medium such as any computer automated manufacturing system connected to the test system.

Referring back to FIG. 1, the system manager 110 includes a test planner 112. The test planner 112 monitors the activities of the testers 120-122 and records historical data from the testers 120-122. The test planner 112 may utilize the historical data in conjunction with real-time operation data from the testers 120-122 to generate a short term test operation simulation model that may be used to schedule use of the testers 120-122.

Figure 4:
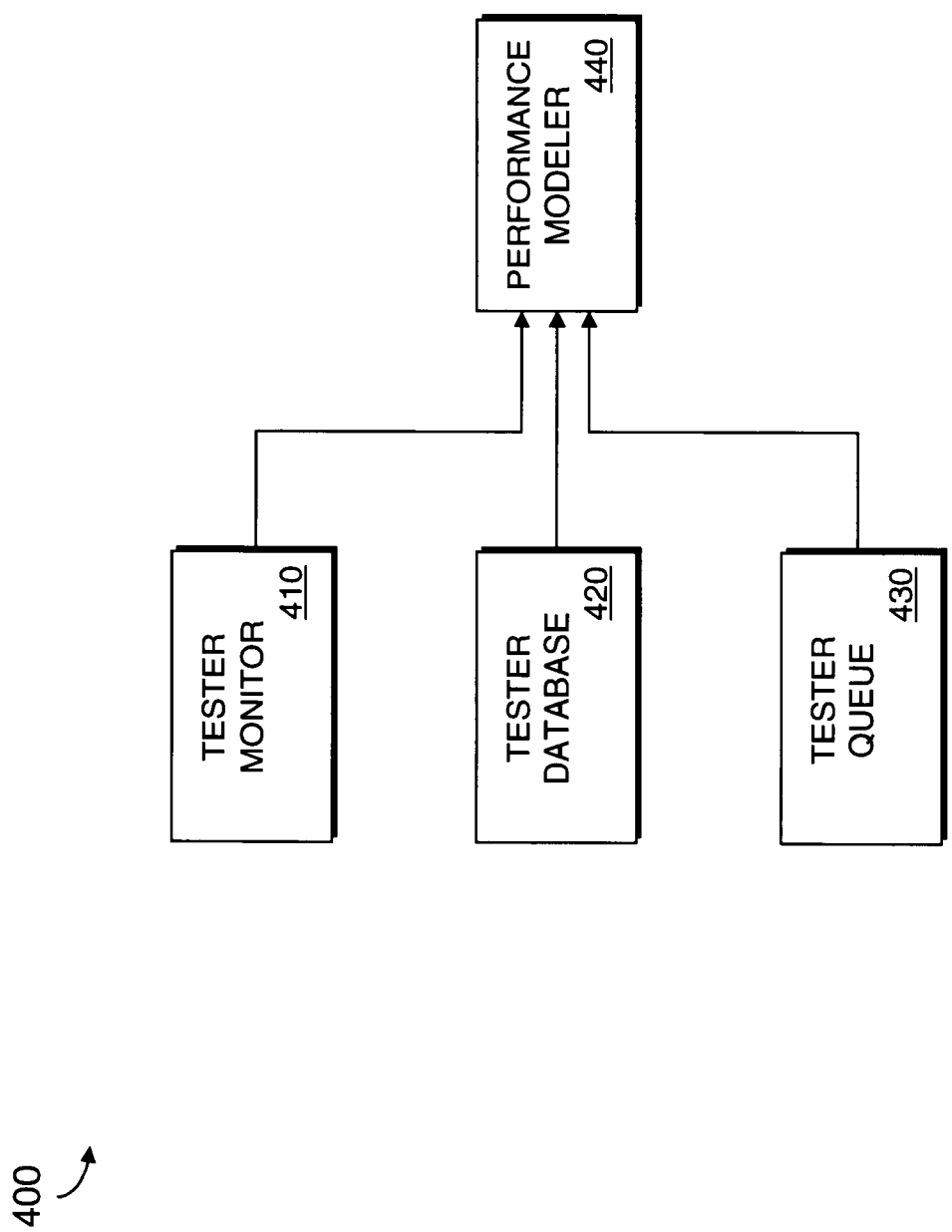
FIG. 4 is a block diagram of a test planner according to an embodiment of the present invention.

FIG. 4 is a block diagram of a test planner 400 according to an embodiment of the present invention. The test planner 400 may be implemented as the test planner 112 shown in FIG. 1. FIG. 4 illustrates modules implementing an embodiment of a test planner. According to one embodiment, test planning may be performed by a computer system executing sequences of instructions represented by the modules shown in FIG. 4. Execution of the sequences of instructions causes the computer system to support test planning as will be described hereafter. In alternate embodiments, hardware circuitry may be used in place of or in combination with software instructions to implement the present invention. Thus, the test planner 400 is not limited to any specific combination of hardware circuitry and software.

The test planner 400 includes a tester monitor 410. The tester monitor 410 receives information about the activities of the testers 120-122. For example, for each tester the tester monitor 410 may collect current real-time operation data such as types of test programs that are being run by the tester, the type of test materials that are being tested such as the wafer, die, and unit tested, yield, test time, test program load time, alarm duration, and information regarding various stage of testing of the test materials. The tester monitor 410 may collect this information by directly accessing a tester, retrieving information from electronic travelers that have information about the tester, or by using other methods or techniques.

The test planner 400 includes a tester database 420. The tester database 420 is coupled to the tester monitor 410 and stores the current operation data collected by the tester planner 410. The tester database 420 includes operation data for a number of test programs run on the testers 120-122 on various test materials over a period of time. This is referred to as historical data.

The test planner 400 includes a tester queue 430. The tester queue 430 collects information about test programs that are to be processed on the testers 120-122 and testing requirements. The information may include the identity of the test materials, the types of test programs that are to be run on the test materials, and scheduling-production requirements. This information may be obtained directly by a test operator through a graphical user interface, by accessing pending requests in records of the testers 120-122 or an electronic traveler associated with the test materials, or by using other methods of techniques.

The test planner 400 includes a performance modeler 440. The performance modeler 440 is capable of analyzing current operations in progress on the testers 120-122 with respect to historical operation data having similar parameter and predicting various operation data such as yield, test time, resource utilization, operation overhead, and other information regarding the current operations in progress. The performance modeler 440 may also analyze current operations in progress together with pending activity determined by the tester queue 430 to determine a test schedule for test materials to be tested in addition to make predictions regarding various operation data. In generating a test schedule for the test materials to be tested, the performance modeler 440 may also take into account various scheduling-production requirements of the test materials to be tested. The test planner 400 is capable of generating predictions of operation data and a test schedule that allows the efficient allocation the use of tester by reducing the over all processing time for test operations.

It should be appreciated that the tester monitor 410, tester database 420, tester queue 430, and performance modeler 440 may be implemented using any known circuitry or any known technique. In an embodiment of the present invention where the test planner 400 is implemented in hardware, the tester monitor 410, tester database 420, tester queue 430, and performance modeler 440 all reside on a single semiconductor substrate.

Figure 5:
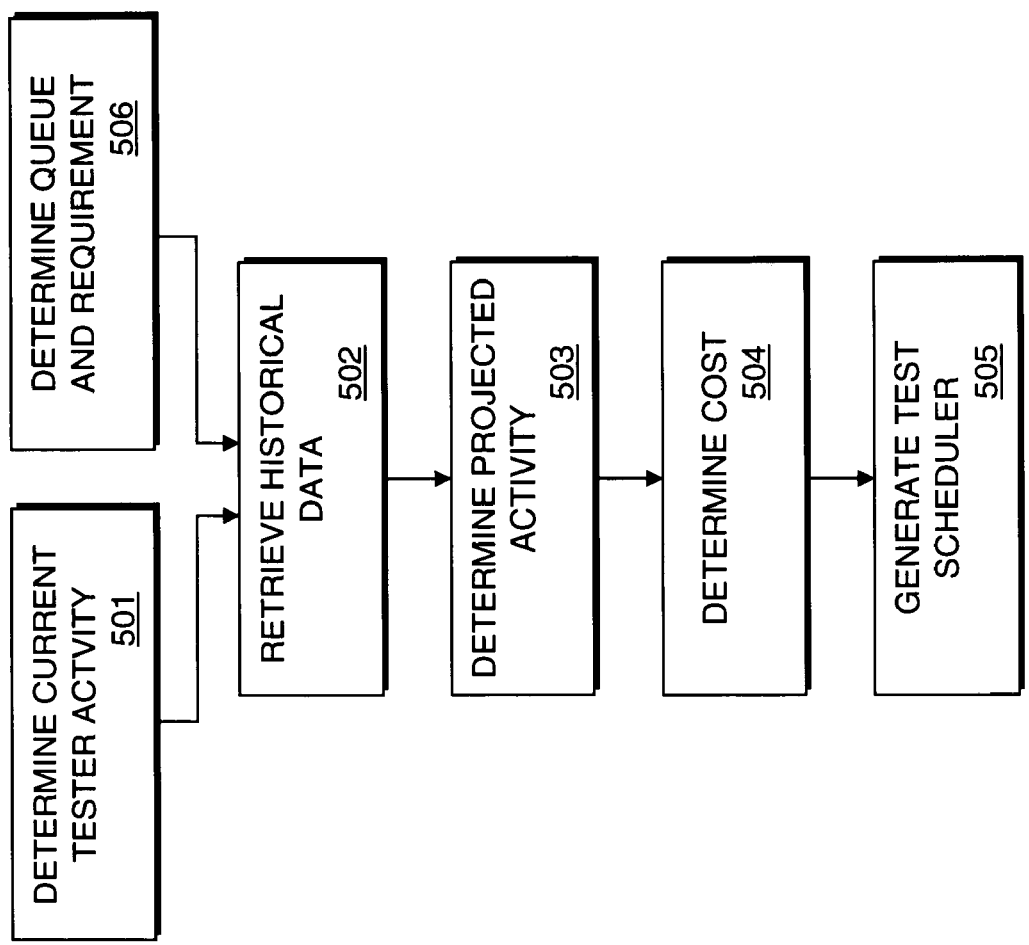
FIG. 5 is a flow chart illustrating a method of test planning according to an embodiment of the present invention.

FIG. 5 is a flow chart illustrating a method of test planning according to an embodiment of the present invention. At 501, current activities of testers are determined. According to an embodiment of the present invention, real-time operation data from the testers such as the types of test programs that are being run by the tester, the type of test materials that are being tested such as the wafer, die, and unit tested, yield, test time, test program load time, alarm duration, and information regarding various stage of testing of the test materials. This may be achieved, for example, by directly accessing records on the testers, accessing recently updated electronic travelers on the system, or other method.

At 502, historical data related to the current activities of the testers are retrieved. According to an embodiment of the present invention, historical data that includes operation data for tests performed in the past on similar test materials may be retrieved.

At 503, the projected activity is determined from the real-time operation data and the historical data related to the current activities. According to an embodiment of the present invention, the projected activity includes predictions on yield, test time, resource utilization, operation overhead, and other information regarding the current operations in progress.

At 504, a cost function is evaluated to determine a cost to test the test materials given the current parameters.

It should be appreciated that the future activities of testers such as test programs to be run on materials to be tested may also be taken into consideration in test planning. For example, at 506 a determination of queued activities and requirements may be determined. The determination may include information on the identity of the test materials, the types of test programs that are to be run on the test materials, and scheduling-production requirements. This information may be obtained directly by a test operator, by accessing pending requests in records of the testers or an electronic traveler associated with the test materials, or by using other methods of techniques.

In an embodiment where future activities are also considered, at 502, historical data related to the future activities of the testers are also retrieved. According to an embodiment of the present invention, historical data that includes operation data for tests performed in the past on similar test materials may be retrieved.

At 503, projected activity is determined from the historical data related to the future activities. According to an embodiment of the present invention, the projected activity includes predictions on yield, test time, resource utilization, operation overhead, and other information regarding the future activities on the testers.

At 504, a cost function is evaluated to determine a cost to test the materials to be tested given the current parameters.

At 505, a test plan may be determined to best utilize the resources on a production floor to test the materials to be tested. The test plan may include a schedule for testing the materials to be tested.

FIGS. 3 and 5 are flow charts illustrating a method for managing testing with an electronic traveler, and a method of test planning. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described below with respect to FIGS. 3 and 5) may be provided as a computer program product, or software, that may include a machine-readable medium having stored thereon instructions. The machine-readable medium may be used to program a computer system or other electronic device. The machine readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for managing testing of test material, comprising:
   identifying an electronic traveler, associated with and residing externally to the test material from a plurality of other electronic travelers stored in a database, that includes information that identifies a plurality of testers on a production floor to be used to test the test material, all tests that are to be performed by the plurality of testers, and rules regarding how the test material should be processed in response to test results;
   performing tests identified by the electronic traveler on the test material; and
   recording the test results from the tests onto the electronic traveler.

2. The method of claim 1, wherein identifying the electronic traveler associated with the test material, comprises matching an electronic traveler identifier associated with the electronic traveler with an electronic traveler identifier labeled on the test material.

3. The method of claim 1, wherein identifying the electronic traveler associated with the test material, comprises:
   scanning an electronic traveler identifier on the test material; and
   matching the electronic traveler identifier with an electronic traveler identifier stored in a production traveler system.

4. The method of claim 1, wherein performing the tests on the test material, comprises:
   identifying test programs to be run on the test material as specified by the electronic traveler;
   loading the test programs on a tester; and
   running the test programs on the tester.

5. The method of claim 1, further comprising applying the rules specified on the electronic traveler to the test results to perform one of retesting the test material, proceeding to a next test, and holding the test material.

6. The method of claim 1, further comprising:
   performing second tests on the test material specified by the electronic traveler; and
   recording test results from the second tests onto the electronic traveler.

7. The method of claim 6, wherein performing second tests on the test material specified by the electronic traveler, comprises:
   identifying second test programs to be run on the test material as specified by the electronic traveler;
   loading the second test programs on a second tester; and
   running the second test programs on the second tester.

8. The method of claim 1, further comprising:
   generating the electronic traveler for the test material; and
   assigning an electronic traveler identifier to the electronic traveler.

9. The method of claim 8, further comprising labeling the test material with the electronic traveler identifier.

10. The method of claim 1, further comprising retrieving the electronic traveler from the database in a system manager external to a tester.

11. The method of claim 1, further comprising transmitting an updated version of the electronic traveler from a tester to a system manager external to the tester.

12. A machine-readable medium having stored thereon sequences of instructions, the sequences of instructions including instructions which, when executed by a processor, causes the processor to perform:
   identifying an electronic traveler, associated with and residing externally to test material from a plurality of other electronic travelers stored in a database, that includes information that identifies a plurality of testers on a production floor to be used to test the test material, all tests that are to be performed by the plurality of testers, and rules regarding how the test material should be processed in response to test results;
   performing tests identified on the electronic traveler on the test material; and
   recording test results from the tests onto the electronic traveler.

13. The machine-readable medium of claim 12, wherein identifying the electronic traveler associated with the test material, comprises matching an electronic traveler identifier associated with the electronic traveler with an electronic traveler identifier labeled on the test material.

14. The machine-readable medium of claim 12, wherein performing tests on the test material, comprises:
   identifying test programs to be run on the test material as specified by the electronic traveler;
   loading the test programs on a tester; and
   running the test programs on the tester.

15. The machine-readable medium of claim 12, further comprising instructions, which when executed by a processor, causes the processor to perform applying the rules specified on the electronic traveler to the test results to perform one of re-testing the test material, proceeding to a next test, and holding the test material.

16. The machine-readable medium of claim 12, further comprising:
   performing second tests on the test material specified by the electronic traveler; and
   recording test results from the second tests onto the electronic traveler.

17. A test manager, comprising:
   a test processor to configure a tester to run test programs specified in an electronic traveler that includes information that identifies a plurality of testers on a production floor to be used to test the test material, all tests that are to be performed by the plurality of testers, and rules regarding how the test material should be processed in response to test results;
   a rules processor to determine whether to re-test the test material, proceed to a next test, or hold the test material in response to test results from the test programs and the rules specified in the electronic traveler; and
   a data recorder to record the test results on the electronic traveler.

18. The test manager of claim 17, further comprising an electronic traveler access unit to access the electronic traveler from a system manager.

19. The test manager of claim 18, further comprising an electronic traveler access unit to transmit an updated version of an electric traveler to a system manager.

20. A method for managing testing of test material, comprising:
   identifying an electronic traveler associated with the test material;
   determining whether tests identified by the electronic traveler to be run on the test material are supported by a tester;
   performing tests identified by the electronic traveler on the test material on the tester upon determining that the tests are supported;
   processing the test material according to results from the tests and rules specified in the electronic traveler; and
   recording the results from the tests onto the electronic traveler.

21. The method of claim 20, wherein processing the test material comprises re-running the tests.

22. The method of claim 20, wherein processing the test material comprises holding the test material for further inspection.

23. The method of claim 20, wherein processing the test material comprises proceeding with a next procedure.

* * * * *